United States Patent
Urban et al.

(10) Patent No.: US 7,423,729 B2
(45) Date of Patent: Sep. 9, 2008

(54) METHOD OF MONITORING THE LIGHT INTEGRATOR OF A PHOTOLITHOGRAPHY SYSTEM

(75) Inventors: Alexander Urban, Freising (DE); Holger Schwekendiek, Freising (DE); Alexander Sirch, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 468 days.

(21) Appl. No.: 11/227,794

(22) Filed: Sep. 15, 2005

(65) Prior Publication Data

US 2006/0055908 A1  Mar. 16, 2006

(30) Foreign Application Priority Data

Sep. 15, 2004  (DE) ........................ 10 2004 044 669

(51) Int. Cl.
*G03B 27/72* (2006.01)
*G03B 27/54* (2006.01)
*G03B 27/42* (2006.01)

(52) U.S. Cl. .............................. 355/69; 355/67; 355/53

(58) Field of Classification Search ................... 355/69, 355/67, 53, 55, 77; 250/208.1; 430/311
See application file for complete search history.

(56) References Cited

U.S. PATENT DOCUMENTS

| 2002/0196418 A1* | 12/2002 | Hagiwara et al. .............. 355/67 |
| 2003/0103196 A1 | 6/2003 | Hirukawa |
| 2005/0041226 A1* | 2/2005 | Tanaka et al. .................. 355/53 |

* cited by examiner

*Primary Examiner*—Peter B Kim
(74) *Attorney, Agent, or Firm*—Frederick J. Telecky, Jr.; Wade J. Brady, III

(57) ABSTRACT

A method of monitoring a light integrator of a photolithography system, wherein the photolithography system comprises a light source for illuminating different fields of a photosensitive layer and a light integrator for measuring the actual exposure doses of the illuminated fields, comprises the step of illuminating different fields of the photosensitive layer in succession. In each illumination step the actual exposure dose is measured by means of the light integrator, the actual exposure time (actualTime) is controlled so that the actual exposure dose to which a field of the photosensitive layer is exposed corresponds to a desired exposure dose, and the actual exposure time (actualTime) is fed to a monitoring system for in-line monitoring the light integrator during illumination of the fields.

21 Claims, 1 Drawing Sheet

METHOD OF MONITORING THE LIGHT INTEGRATOR OF A PHOTOLITHOGRAPHY SYSTEM

FIELD OF THE INVENTION

The present invention relates to a method of monitoring a light integrator of a photolithography system, wherein the photolithography system comprises a light source for illuminating different fields of a photosensitive layer and a light integrator for measuring the exposure doses of the illuminated fields.

BACKGROUND

The different fields of the photosensitive layer are illuminated in succession, wherein in each illumination step the actual exposure dose is measured by means of the light integrator and the actual exposure time is controlled so that the actual exposure dose to which a field of the photosensitive layer is exposed corresponds to a desired exposure dose.

In a photolithography system a mask pattern is imaged on a field of a photosensitive layer which is present on a substrate, for example on a silicon wafer which is used for manufacturing integrated circuits. In order to form well-defined patterns on the substrate, it is important that the photosensitive layer is illuminated with an accurately determined quantity of energy, i.e. with an exact exposure dose. During aging of the light source its intensity is decreasing. To ensure illumination with exact exposure doses, the actual exposure doses during illumination are measured by means of a light integrator. When the actual exposure dose corresponds to a desired exposure dose, exposure of the photosensitive layer is stopped. Therefore the reliability of the light integrator is important for an accurate exposure dose. A malfunction of the light integrator will result in a deviation of the actual exposure dose from the desired exposure dose.

Known methods for testing the light integrator are performed only every two weeks since they are very time consuming. Usually, the test provides a second, calibrated light integrator which measures the light integrator to be checked. When a malfunction of the light integrator is detected, possibly a multitude of lots of wafers have already been exposed with wrong exposure doses leading to a multitude of wrongly processed lots.

SUMMARY

The present invention provides a method of monitoring a light integrator of a photolithography system which immediately provides an error information in case of a malfunction of the light integrator.

According to the method of the present invention, the actual exposure times of the illumination steps are fed to a monitoring system for in-line monitoring the light integrator during illumination of the fields. Thus, in contrast to known methods a calibrated light integrator must not be relied on to detect a possible malfunction of the light integrator in the photolithography system, but a possible malfunction is detected on the basis of the actual exposure times which are known parameters in a conventional photolithography process. An immediate information is obtained about a possible malfunction of the light integrator so that the photolithography system can be stopped immediately to prevent wrong processing of the wafers. The light integrator is monitored in real-time in the process environment.

BRIEF DESCRIPTION OF THE DRAWINGS

Further features and advantages of the invention read from the following description of a preferred method according to the present invention and with reference to the drawings in which.

DETAILED DESCRIPTION OF EMBODIMENTS

Figure 1:
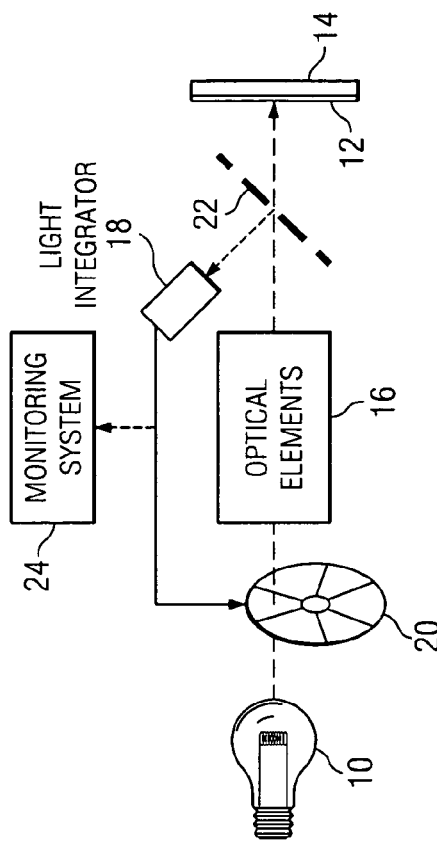
FIG. 1 shows in a schematic manner a photolithography system for imaging a mask pattern on a photosensitive layer.

The photolithography system shown in FIG. 1 of the drawings comprises a light source 10 for illuminating a photosensitive layer 12 on a substrate 14 which is preferably a silicon wafer for manufacturing integrated circuits. The light source 10 is for example a mercury lamp or a laser. Optical elements 16 are arranged in the light path between the light source 10 and the photosensitive layer 12 which conventionally comprise a lens to project the structures of a mask onto a field of the photosensitive layer 12. The optical elements 16 typically also comprise illumination optics which ensure the even illumination of the mask. A light integrator 18 is provided for measuring the amount of light to which the illuminated field of the layer 12 is exposed, i.e. the actual exposure dose. The actual exposure dose should correspond to a desired exposure dose to form structures with well-defined critical dimensions. The desired exposure dose depends, for example, on the thickness of the layer and on the nature of the underlying layer. The light integrator 18 controls that the desired amount of light is exposed onto the wafer. When the desired exposure dose is measured by the light integrator 18, a shutter 20 which is arranged in the light path is closed and illumination of the field of the photosensitive layer 12 is stopped.

In the arrangement of FIG. 1 a portion of the light is coupled out of the light path by means of an optical element 22, e.g. a prism, to be directed towards the light integrator 18. The light source 10, the shutter 20, the light integrator 18 and the optical elements 16 are part of a conventional alignment and exposure tool, e.g. a wafer stepper.

The relative positions of the substrate 14, the mask and the light source 10 differ for different alignment techniques. Generally, it is distinguished between contact printing tools, proximity printing tools and projection systems. Projection systems are the most common exposure tools and can be divided in projection printing (PP) tools and direct step on wafer (DSW) tools. Projection printing (PP) tools use a photomask with the size of the entire wafer. Either the wafer and the mask are moved in synchrony through the light path, or the wafer and the mask are fixed and the light source and the optical elements are moved, transferring the mask image to the wafer. Direct step on wafer tools are used for geometries of less than 2 µm. The mask is a single device image, usually magnified to four times to five times the final device size. The image is projected onto the wafer using reduction optics, with a greater resolution than projection printing.

Figure 2:
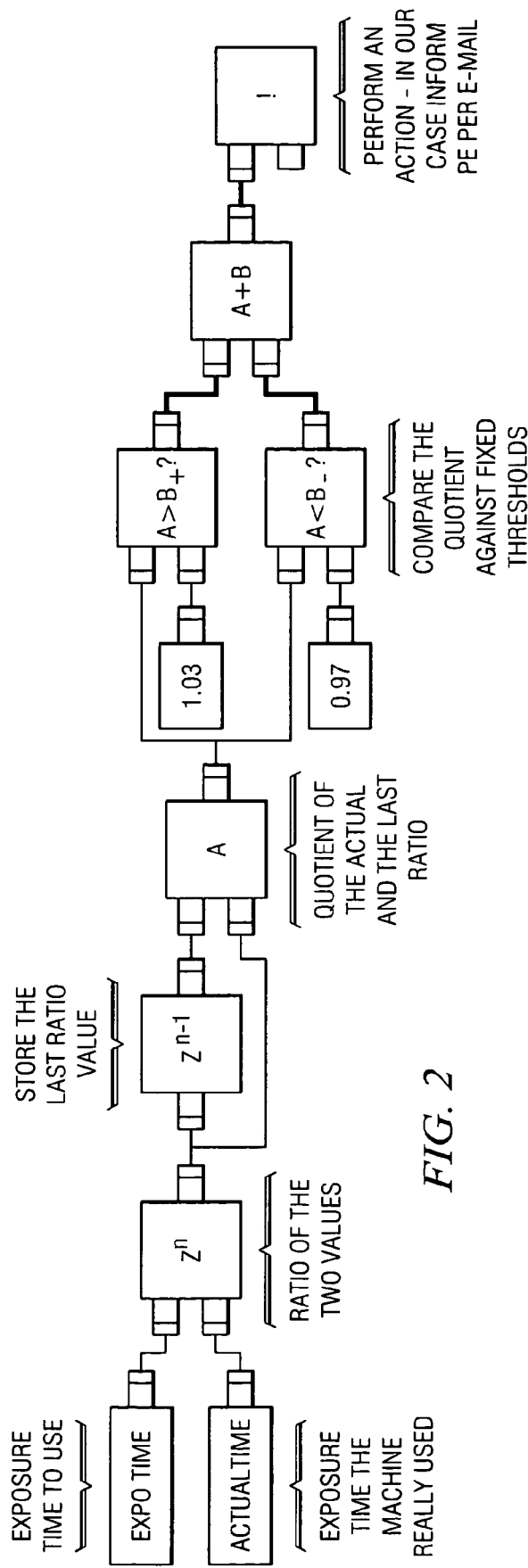
FIG. 2 shows a diagram which illustrates in a schematic manner the preferred method of monitoring the light integrator in accordance with the present invention.

For monitoring the light integrator 18, the actual exposure time of each illumination step is fed from the photolithography system to a monitoring system 24. Further, also the desired exposure time of the respective illumination step is fed from the photolithography system to the monitoring system 24. The desired exposure time is proportional to the product of the desired exposure dose times the light intensity of the light source. Deviations of the actual exposure time from the desired exposure time are due to deviations in the light intensity between the actual value and the value used for calculating the desired exposure time provided that the light integrator is not defective In the diagram of FIG. 2 the preferred method steps for monitoring the light integrator 18 are shown in a schematic manner. In the monitoring system 24, the actual exposure time (actualTime) of an illumination step is divided by the corresponding desired exposure time (ExpoTime) thereby forming an actual ratio $Z^n$. A corresponding previous ratio from the immediately preceding illumination step is stored as $Z^{(n-1)}$ in a memory of the monitoring system 24.

After that a quotient A is formed by division of the actual ratio $Z^n$ by the previous ratio $Z^{(n-1)}$. The quotient A is then compared to threshold values B+, B− to inform about a possible malfunction of the light integrator 18. The quotient A is compared to an upper threshold value B+ and, in case that the quotient A exceeds the upper threshold value B+, an error is indicated. In the same way the quotient A is compared to a lower threshold value B− and, in ease that the quotient A is below the lower threshold value B−, likewise an error is indicated. In case that the quotient A lies in the range between the upper and lower threshold values B+, B−, no error is indicated. The upper and lower threshold values of the preferred method are 1.03 and 0.97, respectively.

Subsequent to the comparison of the quotient A with the upper and lower threshold values B+, B−, the actual ratio $Z^n$ is stored in the memory as a previous ratio $Z^{(n-1)}$ and the above-described procedure is repeated for the following illumination steps.

In case that the light integrator is not defective and there are no fluctuations in the light intensity due to an aging of the light source the quotient A equals "one". Deviations from "one" due to an aging of the light source are very small since the intensity is very slowly decreasing in time compared to the time period between two consecutive illumination steps and thus lie in the range between the upper and lower threshold values. The value of the quotient A is independent of the exposure doses of the consecutive illumination steps since any dependence of the exposure doses has been eliminated by forming the actual and previous ratios $Z^n$ and $Z^{(n-1)}$. Further, wrong assumptions of the light intensity by a constant factor for calculating the desired exposure time have no effect on the value of the quotient A due to the comparison of the exposure times of consecutive illumination steps. Thus, deviations from the upper and lower threshold values, i.e., a drastic change between an actual ratio and the corresponding previous ratio, indicate a malfunction of the light integrator, even if the consecutive illumination steps have been processed with different exposure doses, e.g., illumination from lot to lot.

This process of feeding and evaluating the exposure times of the single illumination steps is continued throughout the processing of the wafers, so that a possible malfunction of the light integrator is detected immediately and a wrong processing of a multitude of wafers is prevented.

When an error is detected, the error is preferably indicated by automatically sending an email to the responsible person, e.g., the process engineer which is responsible for the process performance of the photolithography tool in question. Alternatively or in addition to the sending of the email the error can be indicated on a display panel of the monitoring system 24 with an error symbol and/or with an acoustic signal.

Both the actual exposure time and the desired exposure time are known parameters of a conventional exposure process. They are transmitted from the photolithography tool, e.g., the stepper, via an interface, e.g., the SECS/GEM interface, to the monitoring system. The monitoring system preferably comprises the "Tool Interdiction and Monitoring System" (TIMS®) by means of which data feeds from multiple sources can be combined and the data can be analyzed in real time.

The invention claimed is:

1. A method of monitoring a light integrator of a photolithography system, wherein said photolithography system comprises a light source (10) for illuminating different fields of a photosensitive layer (12) and a light integrator (18) for measuring the actual exposure doses of the illuminated fields, comprising the step of illuminating different fields of said photosensitive layer (12) in succession, wherein in each illumination step the actual exposure dose is measured by means of said light integrator (18), the actual exposure time is controlled so that said actual exposure dose to which a field of said photosensitive layer (12) is exposed corresponds to a desired exposure dose, and said actual exposure time is fed to a monitoring system (24) for in-line monitoring said light integrator (18) during illumination of said fields, wherein the monitoring system performs a calculation using the actual exposure time to determine if the light integrator has malfunctioned.

2. The method according to claim 1, wherein for each illumination step said desired exposure time is fed from said photolithography system to said monitoring system (24).

3. The method according to claim 2, wherein an actual ratio ($Z^n$) is formed by division of said actual exposure time in which a field of said photosensitive layer (12) is illuminated by the corresponding desired exposure time.

4. The method according to claim 3, wherein a quotient (A) is formed by division of said actual ratio ($Z^n$) by a corresponding previous ratio ($Z^{n-1}$) from the immediately preceding illumination step which is stored in a memory of said monitoring system (24).

5. The method according to claim 4, wherein said quotient (A) is compared to an upper threshold value (B+) and an error is indicated in case that said third quotient (A) exceeds said upper threshold value (B+).

6. The method according to claim 5, wherein said upper threshold value (B+) is 1.03.

7. The method according to claim 5, wherein said quotient (A) is compared to a lower threshold value (B−) and an error is indicated in case that said third quotient (A) is below said lower threshold value (B−).

8. The method according to claim 7, wherein said lower threshold value (B−) is 0.97.

9. The method according to claim 5, wherein an email is sent for indication of said error.

10. The method according to claim 4, wherein said actual ratio ($Z^n$) is stored in said memory as a previous ratio ($Z^{n-1}$).

11. The method according to claim 1, wherein a shutter (20) which is arranged in the light path of the photolithography system is closed when said actual exposure dose measured by said light integrator (18) corresponds to said-desired exposure dose.

12. The method according to claim 1, wherein said photosensitive layer (12) is a photoresist layer on a silicon substrate (14).

13. A method of monitoring a light integrator of a photolithography system, comprising the steps of:
    illuminating different fields of a photosensitive layer in succession; and during each illumination step:
    measuring the actual exposure dose by means of said light integrator;
    controlling the actual exposure time so that said actual exposure dose to which a field of said photosensitive layer is exposed corresponds to a desired exposure dose; and feeding said actual exposure time to a monitoring system for in-line monitoring of said light integrator during illumination of said fields, wherein the monitoring system performs a calculation using the actual exposure time to determine if the light integrator has malfunctioned.

14. The method according to claim 13, further comprising, for each illumination step, feeding a desired exposure time from said photolithography system to said monitoring system.

15. The method according to claim 14, further comprising, for each illumination step, calculating an actual ratio ($Z^n$) by division of said actual exposure time by the corresponding desired exposure time.

16. The method according to claim 15, further comprising, for each illumination step, calculating a quotient (A) by division of said actual ratio ($Z^n$) by a corresponding previous ratio ($Z^{n-1}$) from the immediately preceding illumination step which is stored in a memory of said monitoring system.

17. The method according to claim 16, further comprising, for each illumination step, comparing said quotient (A) to an upper threshold value (B+) and indicating an error in case that said quotient (A) exceeds said upper threshold value (B+).

18. The method according to claim 17, wherein said upper threshold value (B+) is 1.03.

19. The method according to claim 16, further comprising, for each illumination step, comparing said quotient (A) to a lower threshold value (B−) and indicating an error in case that said quotient (A) is below said lower threshold value (B−).

20. The method according to claim 19, wherein said lower threshold value (B−) is 0.97.

21. The method according to claim 15, further comprising, after each illumination step, storing said actual ratio ($Z^n$) in said memory as a previous ratio ($Z^{n-1}$).

* * * * *